(12) United States Patent
Lim et al.

(10) Patent No.: US 9,667,248 B2
(45) Date of Patent: May 30, 2017

(54) TOUCH PANEL

(71) Applicant: LG INNOTEK CO., LTD., Seoul (KR)

(72) Inventors: Hyun Seok Lim, Seoul (KR); Hyung Min Sohn, Seoul (KR); Young Sun You, Seoul (KR); Jong Wook Lim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 984 days.

(21) Appl. No.: 13/851,395

(22) Filed: Mar. 27, 2013

(65) Prior Publication Data

US 2013/0256105 A1    Oct. 3, 2013

(30) Foreign Application Priority Data

Mar. 27, 2012  (KR) .................. 10-2012-0030874

(51) Int. Cl.
*G06F 3/041*   (2006.01)
*H03K 17/96*   (2006.01)
*C08J 7/00*    (2006.01)

(52) U.S. Cl.
CPC .............. *H03K 17/96* (2013.01); *C08J 7/00* (2013.01)

(58) Field of Classification Search
CPC ..................... G06F 3/41; G06F 3/44
See application file for complete search history.

(56) References Cited

U.S. PATENT DOCUMENTS

| | | | |
|---|---|---|---|
| 2011/0227875 A1* | 9/2011 | Chung | G06F 3/0412 345/175 |
| 2011/0304572 A1 | 12/2011 | Wang et al. | |
| 2012/0127091 A1* | 5/2012 | Kim | G02F 1/13338 345/173 |
| 2012/0227259 A1* | 9/2012 | Badaye | G06F 3/044 29/846 |
| 2012/0249441 A1* | 10/2012 | Lee | G06F 3/044 345/173 |
| 2013/0016047 A1* | 1/2013 | Masumoto | G02F 1/13338 345/173 |
| 2013/0127742 A1* | 5/2013 | Kang | G02B 5/3025 345/173 |
| 2013/0194204 A1* | 8/2013 | Kang | G06F 3/041 345/173 |
| 2013/0194220 A1 | 8/2013 | Lee et al. | |
| 2013/0224370 A1* | 8/2013 | Cok | C23C 18/06 427/108 |

FOREIGN PATENT DOCUMENTS

| | | |
|---|---|---|
| TW | 201201225 A | 1/2012 |
| TW | 201205149 A1 | 2/2012 |
| TW | 201211858 A1 | 3/2012 |

OTHER PUBLICATIONS

Office Action dated Oct. 19, 2016 in Taiwanese Application No. 102110849.

* cited by examiner

*Primary Examiner* — Kent Chang
*Assistant Examiner* — Scott Au
(74) *Attorney, Agent, or Firm* — Saliwanchik, Lloyd & Eisenschenk

(57) ABSTRACT

A touch panel according to the embodiment includes a substrate including an effective area and a dummy area surrounding the effective area; and an outer dummy layer in the dummy area; a planar layer on the substrate; and a transparent electrode disposed on the substrate to detect a position.

16 Claims, 2 Drawing Sheets

TOUCH PANEL

CROSS-REFERENCE TO RELATED APPLICATION

This application claims the benefit under 35 U.S.C. §119 of Korea Patent Application No. 10-2012-0030874, filed Mar. 27, 2012, which is hereby incorporated by reference in its entirety.

BACKGROUND

The disclosure relates to a touch panel.

Recently, a touch panel, which performs an input function through the touch of an image displayed on a display device by an input device such as a stylus pen or a hand, has been applied to various electronic appliances.

The touch panel may be mainly classified into a resistive touch panel and a capacitive touch panel. In the resistive touch panel, glass is shorted with an electrode due to the pressure of the input device so that a touch point is detected. In the capacitive touch panel, the variation in capacitance between electrodes is detected when a finger of the user is touched on the capacitive touch panel, so that the touch point is detected.

An outer dummy layer is formed to form a logo in a dummy area of such a touch panel. A thickness of the outer dummy layer is thicker than that of a transparent electrode for sensing a touch, so that the transparent electrode may crack at a boundary portion of the outer dummy layer. Thus, an electric property may be deteriorated or the reliability is degraded due to the malfunction.

In recent years, the transparent electrode has been formed by using a nano-wire. Due to a thin thickness of the nano-wire, an electrically open circuit may be caused.

BRIEF SUMMARY

The embodiment provides a touch panel representing improved electric property and reliability.

A touch panel according to the embodiment includes a substrate including an effective area and a dummy area surrounding the effective area; and an outer dummy layer in the dummy area; a planar layer on the substrate; and a transparent electrode disposed on the substrate to detect a position.

The touch panel according to the embodiment includes the planar layer. One surface of the substrate is planarized by forming the planar layer on the entire surface of the substrate and then, the transparent electrode and the wire are formed on the planarized surface, so that a crack of the transparent electrode can be effectively inhibited.

According to the embodiment, a process of patterning the planar layer can be omitted, so that the process can be simplified.

In addition, when the transparent electrode is formed of a carbon nano-tube, a silver nano-tube, graphene, or a nano-mesh, the transparent electrode can be inhibited from cracking and being open circuited through the planar layer. Thus, the electrical stability and reliability can be improved.

DETAILED DESCRIPTION

Figure 1:
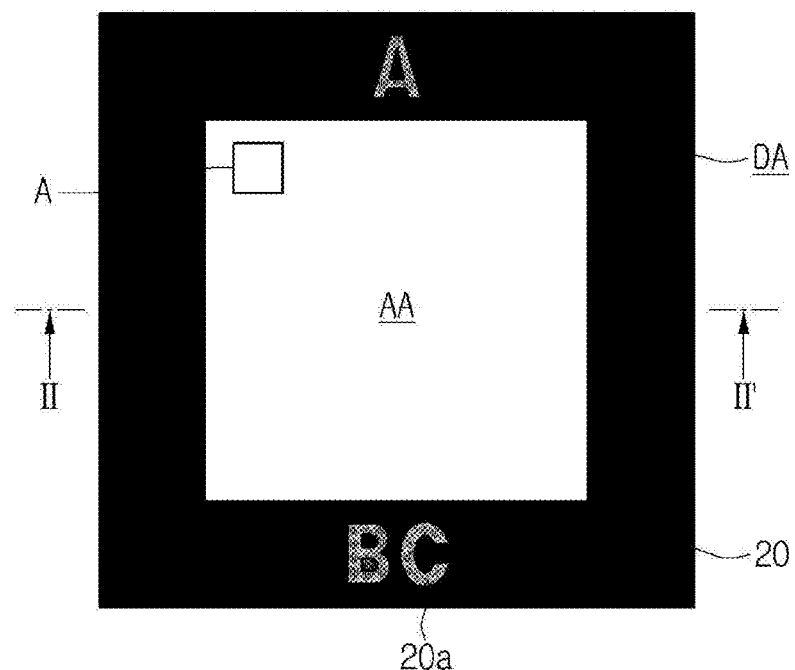
FIG. 1 is a plan view schematically showing a touch panel according to the first embodiment.

In the following description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, the embodiments will be described with reference to the accompanying drawings.

First, a touch panel according to the first embodiment will be described in detail with reference to FIGS. 1 to 3.

FIG. 1 is a plan view schematically showing a touch panel according to the first embodiment. FIG. 2 is an enlarged plan view of portion A of FIG. 1. FIG. 3 is a sectional view taken along line II-II' of FIG. 1.

Figure 2:
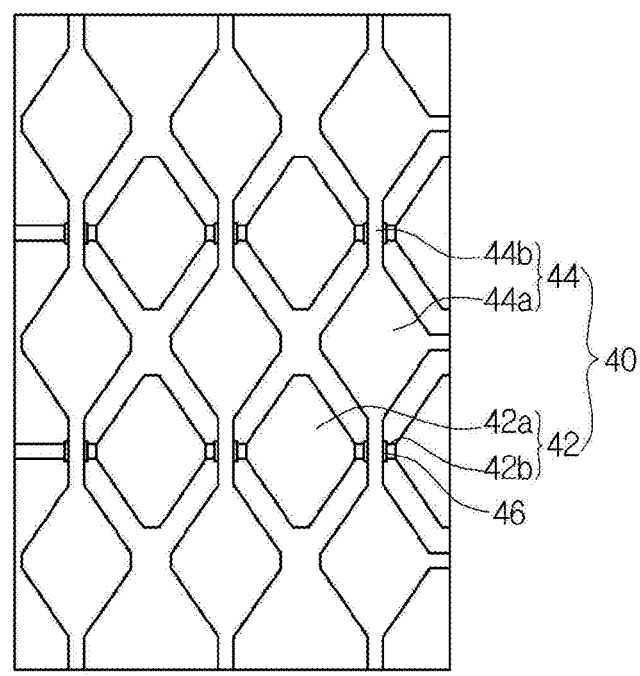
FIG. 2 is an enlarged plan view of portion A of FIG. 1.
Figure 3:
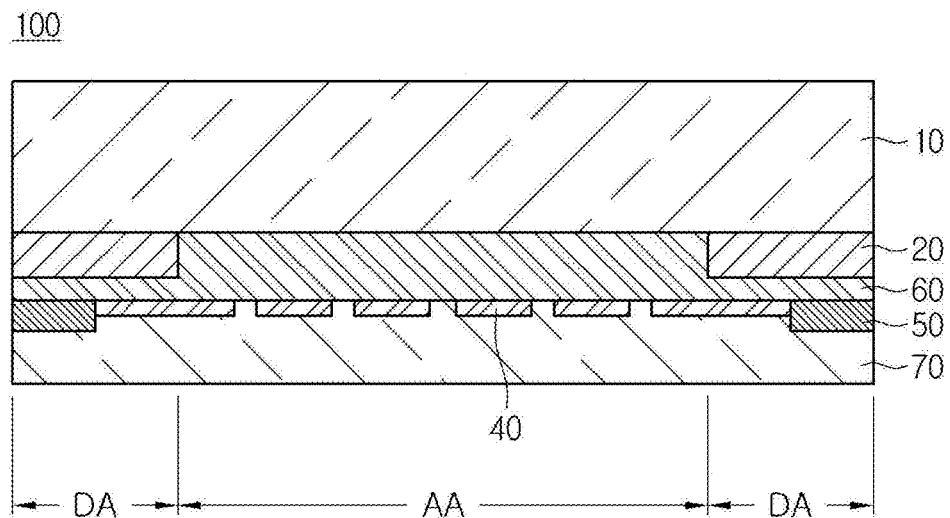
FIG. 3 is a sectional view taken along line II-II' of FIG. 1.

Referring to FIGS. 1 and 2, the touch panel 100 according to the embodiment is defined by an effective area AA, in which the position of an input device is sensed, and a dummy area DA provided at an outer portion of the effective area AA.

In this case, the effective area AA may be provided therein with a transparent electrode 40 to sense an input device. In addition, the dummy area DA may be provided therein with a wire 50 connected to the transparent electrode 40 and a printed circuit board (not shown) to connect the wire 50 to an external circuit (not shown). The dummy area DA may be provided therein with an outer dummy layer 20. A logo 20a may be formed in the outer dummy layer 20. In addition, a planar layer 60 may be formed while covering the outer dummy layer 20. Hereinafter, the details of the touch panel 100 will be described in more detail Referring to FIG. 3, the outer dummy layer 20, the transparent electrode 40 and the planar layer 60 may be formed on a substrate 10. The wire 50 may be connected to the transparent electrode 40 and the planar layer 60. In addition, the wire 50 may be connected to the printed circuit board. Further, a scattering prevention film 70 may be formed thereon while covering the transparent electrode 40, the wire 50, the planar layer 60 and the printed circuit board.

The substrate 10 may be formed of various materials to support the outer dummy layer 20, the transparent electrode 40 and the wire 50 which are formed thereon. For example, the substrate 10 may include a glass substrate or a plastic substrate.

The outer dummy layer 20 is formed in the dummy area DA on one surface of the substrate 10. The dummy layer 20 may be coated with a material having a predetermined color such that the wire 50 and the printed circuit board are not seen from an outside. The outer dummy layer 20 may have a color suitable to a desired exterior thereof. As one example, the outer dummy layer 20 may have a black color by using a black pigment. A desired logo (reference numeral 20a in FIG. 1) may be formed on the outer dummy layer 20 by using various schemes. The dummy layer 20 may be formed through a deposition, print, or wet coating scheme.

The transparent electrode 40 is formed on one surface of the substrate 10. The transparent electrode 40 may formed in various shapes to sense whether an input device such as a finger is touched thereto.

As one example, as shown in FIG. 2, the transparent electrode 40 may include a first electrode 42 and a second electrode 44. The first and second electrodes 42 and 44 include sensing portions 42a and 44a for sensing whether an input device such as a finger is touched thereto, and connecting portions 42b and 44b for connecting the sensing portions 42a and 44a. The connecting portion 42b of the first electrode 42 connects the sensing portion 42a in a first direction (left and right directions in the drawing), and the connecting portion 44b of the second electrode 44 connects the sensing portion 44a in a second direction (up and down directions in the drawing).

An insulating layer 46 is placed between the connecting portions 42b and 44b of the first and second electrodes 42 and 44 at a portion at which the connecting portions 42b and 44b cross each other, so that the first and second electrodes 42 and 44 may be inhibited from being electrically short-circuited between them. The insulating layer 46 may be formed of a transparent insulating material such that the connecting portions 42 and 44b may be insulated from each other. For example, the insulating layer 46 may include a metallic oxide such as a silicon oxide and resin such as acrylic.

As one example, according to the embodiment, the sensing portions 42a and 44a of the first and second electrodes 42 and 44 may be formed on the same layer, so that the sensing portions 42a and 44a may be formed as a single layer. Thus, usage of the transparent conductive material layer may be minimized and a thickness of the touch panel 100 may be reduced.

If the input device such as a finger is touched on the touch panel 100, the difference in capacitance is made in a portion touched by the input device, and the touched portion having the difference in capacitance may be detected as a touch point. Although a structure, in which the transparent electrode 40 is applied to a capacitive touch panel, is disclosed in the embodiment, the embodiment is not limited thereto. Thus, a structure, in which the transparent electrode 40 is applied to a resistive touch panel, may be formed.

The transparent electrode 40 may include a transparent conductive material allowing electricity to flow therethrough without interrupting the transmission of light. To this end, the transparent electrode 40 may include a carbon nano-tube, a silver nano-tube, grapheme, and a nano-mesh. Further, the transparent electrode 40 may include various materials such as indium tin oxide, indium zinc oxide, copper oxide, or a carbon nano-tube (CNT).

Referring to FIG. 2 again, according to the embodiment, the transparent electrode 40 may be formed on the outer dummy layer 20 such that the transparent electrode 40 may be electrically connected to the wire 50 formed on the outer dummy layer 20. The planar layer 60 may be formed such that the planar layer 60 covers a boundary of the outer dummy layer 20. For example, the planar layer 60 may be located between the outer dummy layer 20 and the transparent electrode 40.

In detail, the planar layer 60 may be formed such that the planar layer 60 surrounds the outer dummy layer. Specifically, the planar layer 60 may have a pattern of continuously covering the top and side surfaces of the outer dummy layer 20. The planar layer 60 may be formed such that the planar layer 60 covers the entire surfaces of the substrate 10 and the outer dummy layer 20, and in addition, the transparent electrode 40 and the wire 50 may be formed on the planar layer 60. That is, according to the embodiment, one surface of the substrate 10 is planarized by forming the planar layer 60 on the entire surface and then, the transparent electrode 40 and the wire 50 are formed on the planarized surface, so that a crack of the transparent electrode 40 may be effectively inhibited.

According to the embodiment, a process of patterning the planar layer 60 may be omitted, so that the process may be simplified.

The planar layer 60 may include a transparent material having an insulating property. In detail, the planar layer 60 may include a material having the transmittance of 90% or more such that the material does not exert an influence on the transmittance of the touch panel.

Specifically, the planar layer 60 may include a transparent polymer material. For example, the planar layer 60 may include PE (polyethylene), PET (poly(ethylene terephthalate)), PC (polycarbonate) or PMMA (Poly(methyl methacrylate)). Further, the planar layer 60 may include thermosetting resin or ultraviolet curable resin.

The planar layer 60 may be subject to the index matching between the substrate 10 and the transparent electrode 40. The characteristics such as the transmittance, the reflectance, and the chrominance (b*, yellowish) can be optimized due to the index matching. In addition, the pattern of the transparent electrode 40 including a transparent conductive material may be in the invisible state through index matching. Thus, the visibility of the display device employing the touch panel may be improved.

A thickness of the planar layer 60 may be in the range of 1 μm to 100 μm. When the thickness of the planar layer 60 is less than 1 μm, there is a possibility that the planar layer 60 itself is short-circuited. When the thickness of the planar layer 60 is more than 100 μm, the thickness of the touch panel may be increased.

The planar layer 60 may be formed by using various schemes of deposition, printing, or coating. For example, the planar layer 60 may be formed through various schemes such as a spin coating, a roll coating, a slit die coating, a screen coating, an ink jet printing, or an aerogel-jet printing.

When the transparent electrode 40 may be formed of a carbon nano-tube, a silver nano-tube, grapheme, or a nano-mesh, the planar layer 60 may inhibit the transparent electrode 40 from cracking and being open circuited. Thus, the electrical stability and reliability may be improved.

The dummy area DA of the substrate 10 is provided therein with the wire 50 connected to the transparent electrode 40, and the printed circuit board connected to the wire 40. Since the wire 50 is provided in the dummy area DA, the wire 50 may include metal representing superior electrical conductivity. The printed circuit board may have various forms. For example, the printed circuit board may include a flexible printed circuit board (FPCB).

The scattering prevention film 70 may be formed to cover the transparent electrode 40, the wire 50 and the printed circuit board. The scattering prevention film 70 inhibits fragments from being scattered when the touch panel 100 is broken due to the impact. The scattering prevention film 70 may include various materials or be formed in various structures. Although the scattering prevention film 70 placed at a lower surface of the substrate 10 is disclosed in the embodiment, the embodiment is not limited thereto. The scattering prevention film 70 may be formed at various positions.

Hereinafter, a touch panel according to a second embodiment will be described in detail with reference to FIG. 4. In the following description, the details of structures and components the same as those described above or extremely similar to those described above will be omitted except for only structures and components making the difference from those described above for the purpose of clear and simple explanation.

Figure 4:
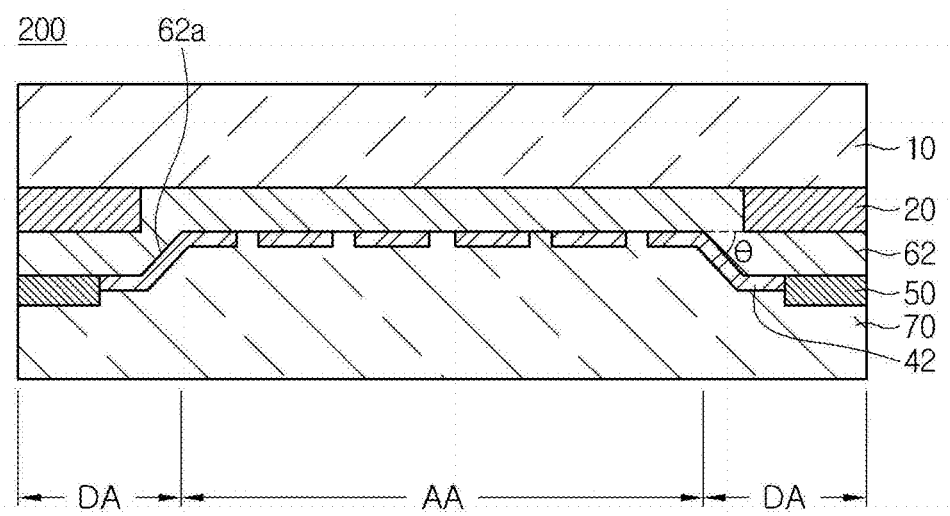
FIG. 4 is a sectional view showing a touch panel according to the second embodiment.

FIG. 4 is a sectional view showing the touch panel according to the second embodiment.

Referring to FIG. 4, a planar layer 62 included in the touch panel 200 according to the second embodiment includes an inclined surface 62a. In detail, the planar layer 62 includes the inclined surface 62a which is a side surface of the planar layer 62, which faces effective area AA of a substrate 10, which is inclined to the substrate 10.

An angle θ between the inclined surface 62a and a top surface of the substrate 10 located inward of the inclined surface 62a may be in the range of 1° to 90°. Preferably, the angle θ may be equal to or less than 30°. When the angle θ is equal to or less than 30°, the possibility of open-circuit of the transparent electrode 42 due to step difference when forming the transparent electrode 42 on the planar layer 62 may be minimized.

In order to form the planar layer 62 including the inclined surface 62a, a coating, printing or depositing speed may be varied when the planar layer 62 is formed.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch panel comprising:
   a substrate including an effective area and a dummy area surrounding the effective area;
   an outer dummy layer disposed on the dummy area of the substrate;
   a planar layer disposed on the effective area and the dummy area of the substrate;
   a transparent electrode disposed on the planar layer;
   a wire disposed on the dummy area of the planar layer; and
   a printed circuit board on the dummy area of the planar layer;
   wherein the wire is connected to the transparent electrode, and the printed circuit board is connected to the wire;
   wherein the transparent electrode extends from the effective area to the dummy area;
   wherein the planar layer is interposed between the transparent electrode of the dummy area and the outer dummy layer;
   wherein the planar layer is a coating layer;
   wherein the outer dummy layer, the planar layer, the transparent electrode, the wire, and the printed circuit board are disposed on one surface of the substrate;
   wherein a sum of a thickness of the outer dummy layer and a thickness of the planar layer in the dummy area is greater than or equal to a thickness of the planar layer disposed in the effective area;
   wherein one surface of the outer dummy layer is in direct contact with the substrate;
   wherein the other surface facing the one surface of the outer dummy layer is in direct contact with the planar layer;
   wherein a side surface of the outer dummy layer is in direct contact with the planar layer; and
   wherein one surface of the planar layer is in direct contact with the transparent electrode, the wire, and the printed circuit board.

2. The touch panel of claim 1, wherein a side surface of the planar layer facing the effective area includes an inclined surface inclined with respect to the substrate.

3. The touch panel of claim 2, wherein an angle between the inclined surface and a top surface of the substrate located inward of the inclined surface is in a range of 1° to 30°, and wherein the angle between the inclined surface and the top surface of the substrate located inward of the inclined surface corresponds to an angle of the transparent electrode disposed on the inclined surface.

4. The touch panel of claim 1, wherein the planar layer has a thickness in a range of 1 μm to 100 μm.

5. The touch panel of claim 1, wherein the outer dummy layer has a thickness thicker than a thickness of the transparent electrode.

6. The touch panel of claim 1, wherein the planar layer includes a polymer material.

7. The touch panel of claim 1, wherein the transparent electrode includes at least one selected from the group consisting of a carbon nano-tube, a silver nano-wire and a graphene.

8. The touch panel of claim 1, wherein the transparent electrode has a mesh shape.

9. The touch panel of claim 1, wherein the transparent electrode includes a first electrode and a second electrode which cross each other, and the first electrode and the second electrode are formed on a same layer.

10. The touch panel of claim 1, wherein the planar layer is index-matched with the transparent electrode.

11. The touch panel of claim 1, wherein an area of the planar layer is larger than an area of the outer dummy layer.

12. The touch panel of claim 1, wherein a width of the outer dummy layer is greater than a width of the wire.

13. The touch panel of claim 1, wherein a thickness of the wire is greater than a thickness of the transparent electrode.

14. The touch panel of claim 1, wherein the planar layer comprises a material having a transmittance of 90% or more.

15. The touch panel of claim 1, further comprising a scattering prevention film disposed on the transparent electrode, the wire, and the printed circuit board.

16. The touch panel of claim 15, wherein a thickness of the scattering prevention film is greater than a thickness of the transparent electrode.

* * * * *